US009105695B2

(12) United States Patent
Shek et al.

(10) Patent No.: US 9,105,695 B2
(45) Date of Patent: Aug. 11, 2015

(54) COBALT SELECTIVITY IMPROVEMENT IN SELECTIVE COBALT PROCESS SEQUENCE

(71) Applicant: Applied Materials, Inc., Santa Clara, CA (US)

(72) Inventors: Mei-yee Shek, Palo Alto, CA (US); Weifeng Ye, San Jose, CA (US); Li-Qun Xia, Cupertino, CA (US); Kang Sub Yim, Palo Alto, CA (US); Kelvin Chan, San Ramon, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/285,535

(22) Filed: May 22, 2014

(65) Prior Publication Data
US 2014/0349480 A1 Nov. 27, 2014

Related U.S. Application Data

(60) Provisional application No. 61/827,217, filed on May 24, 2013.

(51) Int. Cl.
| | |
|---|---|
| H01L 21/44 | (2006.01) |
| H01L 21/311 | (2006.01) |
| H01L 21/768 | (2006.01) |
| H01L 23/532 | (2006.01) |
| H01L 21/02 | (2006.01) |
| H01L 21/285 | (2006.01) |

(52) U.S. Cl.
CPC ........ *H01L 21/7685* (2013.01); *H01L 21/0217* (2013.01); *H01L 21/02274* (2013.01); *H01L 21/28562* (2013.01); *H01L 21/76834* (2013.01); *H01L 23/53238* (2013.01)

(58) Field of Classification Search
CPC .................... H01L 21/7685; H01L 21/76843; H01L 21/02063; H01L 21/02035; H01L 23/53238
USPC ................................. 438/652, 678, 694, 695
See application file for complete search history.

(56) References Cited

U.S. PATENT DOCUMENTS

| | | | |
|---|---|---|---|
| 6,902,605 B2 | 6/2005 | Kolics et al. | |
| 6,962,873 B1 | 11/2005 | Park | |
| 8,278,216 B1 | 10/2012 | Alers et al. | |
| 2005/0136193 A1 | 6/2005 | Weidman et al. | |
| 2009/0269507 A1 | 10/2009 | Yu et al. | |
| 2010/0237501 A1* | 9/2010 | Tomizawa et al. | 257/750 |
| 2010/0248473 A1 | 9/2010 | Ishizaka et al. | |
| 2010/0255676 A1* | 10/2010 | Kim et al. | 438/652 |
| 2010/0304566 A1 | 12/2010 | Fischer et al. | |
| 2011/0244680 A1 | 10/2011 | Tohnoe et al. | |
| 2011/0285021 A1 | 11/2011 | Yang et al. | |
| 2013/0236657 A1 | 9/2013 | Anthis | |

* cited by examiner

*Primary Examiner* — Karen Kusumakar
(74) *Attorney, Agent, or Firm* — Patterson & Sheridan, LLP

(57) ABSTRACT

Embodiments of the invention provide processes to selectively form a cobalt layer on a copper surface over exposed dielectric surfaces. Embodiments described herein control selectivity of deposition by preventing damage to the dielectric surface, repairing damage to the dielectric surface, such as damage which can occur during the cobalt deposition process, and controlling deposition parameters for the cobalt layer.

20 Claims, 7 Drawing Sheets

COBALT SELECTIVITY IMPROVEMENT IN SELECTIVE COBALT PROCESS SEQUENCE

CROSS-REFERENCE TO RELATED APPLICATIONS

This application claims benefit of U.S. Provisional Patent Application Ser. No. 61/827,217, filed May 24, 2013, which is incorporated herein by reference.

BACKGROUND

1. Field

Embodiments disclosed here generally relate to methods of improving metallization for manufacturing semiconductor devices, more particularly, embodiments relate to improved selectivity in cobalt deposition.

2. Description of the Related Art

Copper is the current metal of choice for use in multilevel metallization processes that are crucial to semiconductor device manufacturing. The multilevel interconnects that drive the manufacturing processes require planarization of high aspect ratio apertures including contacts, vias, lines, and other features. Filling the features without creating voids or deforming the feature geometry is more difficult when the features have higher aspect ratios. Reliable formation of interconnects is also more difficult as manufacturers strive to increase circuit density and quality.

As integrated devices becomes smaller and more complex, interconnect dimensions must shrink to accommodate. Smaller interconnects naturally create an increase in current density in those interconnects. As the current density increases with shrinking device geometry scales, improvement in electromigration (EM) is needed. One method to improve EM lifetime is to deposit a selective Cobalt capping on the surface of the copper interconnect before dielectric barrier encapsulation.

The copper interconnects and other features are generally formed in a porous low k dielectric layer, which serves as a barrier between the various features deposited on a substrate. Cobalt deposition on the dielectric layer can decrease the barrier properties of the dielectric layer. As such, selectivity of the cobalt deposition for copper as opposed to the dielectric layer should be continually improved.

Therefore, there is a continuing need for increased selectivity for copper over dielectric regions during cobalt deposition.

SUMMARY

Embodiments described herein generally provide methods to selectively form a cobalt layer on a copper surface while minimizing deposition of cobalt on exposed dielectric surfaces. In one embodiment, a method for forming a cobalt cap can include positioning a substrate within a processing chamber, wherein the substrate comprises a copper surface with a contamination layer and a dielectric surface with a plurality of exposed methyl groups; exposing the substrate to a preclean gas during an anneal process at a first temperature, wherein the plurality of exposed methyl groups are preserved and wherein the contamination layer is removed; exposing the substrate to a cobalt deposition gas comprising a cobalt precursor gas at a second temperature to form a cobalt-containing layer selectively over the copper surface and depositing a dielectric barrier layer over the cobalt-containing layer and the dielectric surface.

In another embodiment, a method for forming a cobalt cap can include positioning a substrate within a processing chamber, wherein the substrate comprises a copper surface and a dielectric surface with a plurality of exposed methyl groups; exposing the substrate to a deposition gas comprising a cobalt precursor gas at a first temperature to form a cobalt-containing layer selectively over the copper surface, the cobalt-containing layer comprising an inactive surface; forming a plasma in the presence of a treatment gas to create an activated treatment gas, the treatment gas comprising ammonia; delivering the activated treatment gas to the inactive surface of the cobalt-containing layer to create an active surface, wherein one or more of the plurality of exposed methyl groups are removed; regenerating the exposed methyl groups using a carbon containing deposition gas; sequentially repeating the exposing of the substrate to the deposition gas, forming of the plasma in the presence of the treatment gas, delivering the activated treatment gas and regenerating the exposed methyl groups using the carbon containing deposition gas until the cobalt-containing layer has achieved the desired thickness and depositing a dielectric barrier layer over the cobalt-containing layer and the dielectric surface.

In another embodiment, a method for forming a cobalt cap can include exposing the processing chamber to a silicon nitride deposition gas in the presence of high RF power; exposing the processing chamber to a densifying gas comprising ammonia in the presence of high RF power; positioning a substrate within a processing chamber, wherein the substrate comprises a copper surface with a contamination layer and a dielectric surface with a plurality of exposed methyl groups; exposing the substrate to a preclean gas during an anneal process at a first temperature, wherein the exposed methyl groups are preserved and wherein the contamination layer is removed; exposing the substrate to a deposition gas comprising a cobalt precursor gas at a second temperature to form a cobalt-containing layer selectively over the copper surface, the cobalt-containing layer comprising an inactive surface; forming a plasma in the presence of a treatment gas to create an activated treatment gas, the treatment gas comprising ammonia; delivering the activated treatment gas to the inactive surface of the cobalt-containing layer to create an active surface, wherein one or more of the plurality of exposed methyl groups are removed; regenerating the exposed methyl groups using a carbon containing deposition gas; sequentially repeating the exposing of the substrate to the deposition gas, forming of the plasma in the presence of the treatment gas, delivering the activated treatment gas and regenerating the exposed methyl groups using a carbon containing deposition gas until the cobalt-containing layer has achieved the desired thickness and depositing a dielectric barrier layer over the cobalt-containing layer and the dielectric surface.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein provide a method that utilizes selective deposition of a cobalt-containing layer or material over copper surfaces to prevent copper electromigration. The transition metal, for example, cobalt, improves copper boundary region properties to promote adhesion, decrease diffusion and agglomeration, and encourage uniform roughness and wetting of the substrate surface during processing. Embodiments provide that a cobalt-containing layer may be selectively deposited on a copper contact or surface on a substrate while leaving exposed dielectric surfaces on the substrate.

Copper Surface Treatment

Figure 1A:
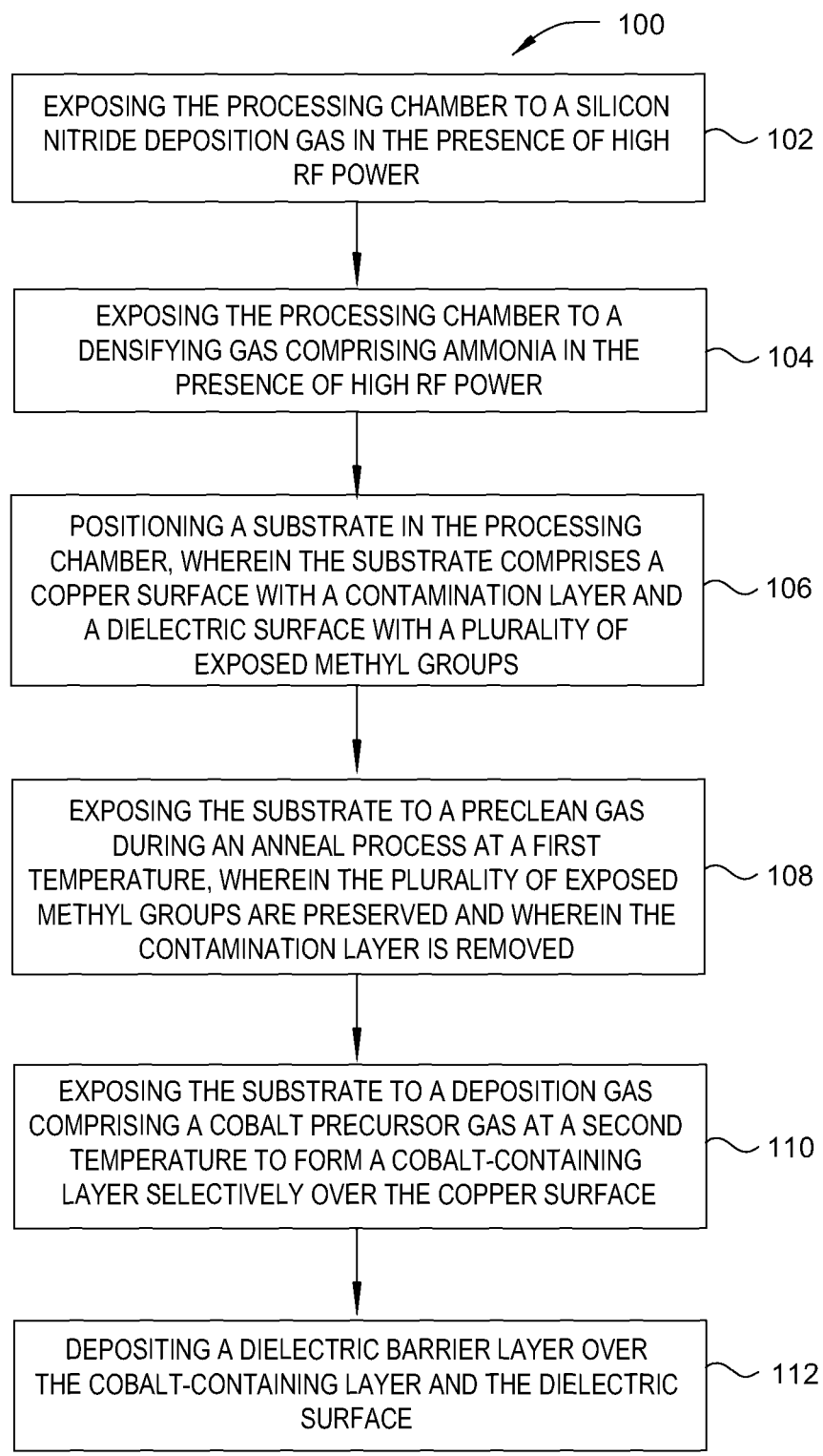
FIG. 1A depicts a flow chart illustrating a copper surface treatment according to one embodiment.

FIG. 1A depicts a flow chart illustrating a method 100 according to an embodiment of the invention. The method 100 may be used to prepare a copper surface for receiving a cobalt cap selectively over a copper contact surface on a substrate. In one embodiment, steps 102-112 of the method 100 may be used on substrate stack 150, depicted in FIGS. 1B-1F. The method 100 can begin with exposing a processing chamber to a silicon nitride deposition gas in the presence of high RF power, as in step 102; exposing the processing chamber to a densifying gas comprising ammonia in the presence of high RF power, as in step 104; positioning a substrate in the processing chamber, wherein the substrate comprises a copper surface with a contamination layer and a dielectric surface with a plurality of exposed methyl groups, as in step 106; exposing the substrate to a preclean gas during an anneal process at a first temperature, wherein the plurality of exposed methyl groups are preserved and wherein the contamination layer is removed, as in step 108; exposing the substrate to a deposition gas comprising a cobalt precursor gas at a second temperature to form a cobalt-containing layer selectively over the copper surface, as in step 110; and depositing a dielectric barrier layer over the cobalt-containing layer and the dielectric surface, as in step 112.

Figure 1B:
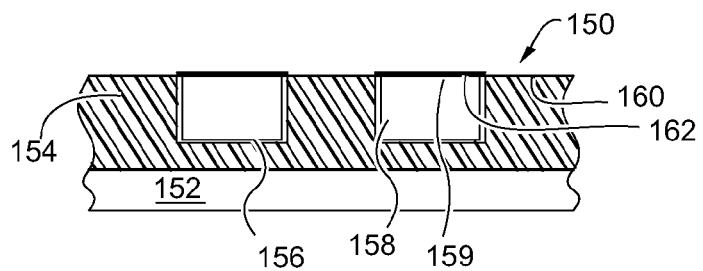
FIGS. 1B-1F depict schematic views of a substrate with a copper surface treatment and cobalt layer deposition according to one embodiment.

FIG. 1B depicts a substrate stack 150 including a dielectric layer 154 disposed over substrate 152 after being exposed to a polishing process, oxidizing environment or other reagent. Substrates may have various dimensions, such as 200 mm or 300 mm diameter wafers, as well as, rectangular or square panes. Unless otherwise noted, embodiments and examples described herein are preferably conducted on substrates with a 200 mm diameter or a 300 mm diameter, more preferably, a 300 mm diameter. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, and patterned or non-patterned wafers. Substrates may be exposed to a pre-treatment process to polish, etch, reduce, oxidize, hydroxylate, anneal, and/or bake the substrate surface.

"Substrate surface" or "substrate," as used herein, refers to any substrate or material surface formed on a substrate upon which film processing is performed during a fabrication process. For example, a substrate surface on which processing may be performed include materials such as monocrystalline, polycrystalline or amorphous silicon, strained silicon, silicon on insulator (SOI), doped silicon, silicon germanium, germanium, gallium arsenide, glass, sapphire, silicon oxide, silicon nitride, silicon oxynitride, and/or carbon doped silicon oxides, such as $SiO_xC_y$, for example, BLACK DIAMOND® low-k dielectric, available from Applied Materials, Inc., located in Santa Clara, Calif.

The substrate stack 150 can include one or more copper features 158. Copper features 158 can be disposed within dielectric layer 154 and are separated from dielectric layer 154 by barrier layer 156. Dielectric layer 154 contains a dielectric material, such as a low-k dielectric material. In one example, dielectric layer 154 contains a porous low-k dielectric material, such as a silicon carbide oxide material or a carbon doped silicon oxide material, for example, BLACK DIAMOND® IIx low-k dielectric material, available from Applied Materials, Inc., located in Santa Clara, Calif.

Barrier layer 156 can be conformally deposited into the feature within the dielectric layer 154. Barrier layer 156 may be formed or deposited by a PVD process, an ALD, or a CVD process, and may have a thickness within a range from about 5 Å to about 50 Å, preferably, from about 10 Å to about 30 Å. Barrier layer 156 may contain titanium, titanium nitride, tantalum, tantalum nitride, tungsten, tungsten nitride, silicides thereof, derivatives thereof, or combinations thereof. In some embodiments, barrier layer 156 may contain a tantalum/tantalum nitride bilayer or titanium/titanium nitride bilayer. In one example, barrier layer 156 contains tantalum nitride and metallic tantalum layers deposited by PVD processes.

Copper features 158, depicted here as two copper features 158, can then be formed over the barrier layer 156. Copper features 158 can be formed by one or more methods known in the art. In one embodiment, the copper features 158 are formed by depositing a copper seed layer using PVD and then electrochemical plating for the bulk fill of the copper feature 158. Generally, the copper features 158 are not planar upon deposition. Thus, a polishing process is performed prior to further deposition on the substrate stack 150.

During the polishing process, such as a chemical mechanical polishing (CMP) process, copper surfaces 159 of copper features 158 are exposed across substrate field and contamination layers 162 are formed on the copper surfaces 159. Contamination layers 162 usually contain copper oxides formed during or after the polishing process. The copper surfaces 159 of copper features 158 may be oxidized by peroxides, water, or other reagents in the polishing solution or by oxygen within the ambient air. Contamination layers 162 may also include moisture, polishing solution remnants including surfactants and other additives, or particles of polished away materials. Therefore, a copper surface treatment process may be beneficial to enhance adhesion between the copper layer and other layers.

As part of the copper surface treatment process, a processing chamber can be exposed to a silicon nitride deposition gas at a high RF power, as in step 102. The processing chamber can be a standard processing chamber for plasma enhanced deposition. In one example, the processing chamber can be a Producer Barrier Low k (BLOk) Plasma-Enhanced Chemical Vapor Deposition (PECVD) chamber, available from Applied Materials, Inc., located in Santa Clara, Calif. The chamber described or listed here is not intended to be limiting of possible processing chambers which can be used in one or more embodiments. Other chambers, including chamber from other manufacturers, may be used without diverging from the scope of the embodiments described herein.

Silicon nitride can be deposited using methods known in the art, such as CVD or PECVD. In one embodiment, silane and ammonia gases are ignited by an RF plasma to deposit the $SiN_x$ layer. The $SiN_x$ layer can be deposited to a thickness between 300 Å and 1000 Å, such as 350 Å.

A high RF power is delivered to ignite the plasma. The RF plasma may be ignited within the processing chamber for an in situ plasma process, or alternative, may be formed by an external source, such as a RPS system. The RF generator may be set at a frequency within a range from about 100 kHz to about 60 MHz. In one example, a RF generator, with a frequency of 13.56 MHz, may be set to have a power output within a range from about 100 watts to about 1,000 watts, preferably, from about 250 watts to about 600 watts, and more preferably, from about 300 watts to about 500 watts. In another example, a RF generator, with a frequency of 350 kHz, may be set to have a power output within a range from about 200 watts to about 2,000 watts, preferably, from about 500 watts to about 1,500 watts, and more preferably, from about 800 watts to about 1,200 watts, for example, about 1,000 watts. In one example, a surface of substrate may be exposed to a plasma having a power per surface area value within a range from about 0.01 watts/cm² to about 10.0 watts/cm². In another example, a surface of substrate may be exposed to a plasma having a power per surface area value within a range from about 0.05 watts/cm² to about 6.0 watts/cm².

The processing chamber is then exposed to a densifying gas comprising ammonia ($NH_3$) in the presence of high RF power, as in step 104. The $NH_3$ is flowed into the chamber without silane or other components previously described for deposition of the $SiN_x$ layer. For a chamber sized for a 300 mm substrate, the flow rate can be between 2000 sccm and 3000 sccm of $NH_3$. In further embodiments, the $NH_3$ can be coflowed into the chamber with $N_2$, flowed into the same chamber at a flow rate of between 1000 sccm and 2000 sccm. The high power RF can be as described above, with reference to step 102. The added ammonia reacts with the $SiN_x$ layer to finalize the seasoning of the processing chamber, by increasing the density the $SiN_x$ layer without creating additional bulk in the layer.

After the processing chamber has been seasoned, the substrate stack 150 can be positioned in the processing chamber, wherein the substrate stack 150 comprises a copper surface with a contamination layer 162 and a dielectric surface 160 with a plurality of methyl groups, as in step 106. The dielectric layer 154 can have a plurality of methyl groups formed at the dielectric surface 160. The copper features 158 can further have a contamination layer 162, formed as described above.

Figure 1C:
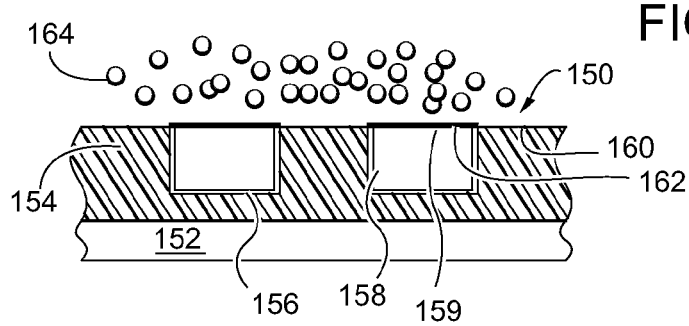
Figure 1D:
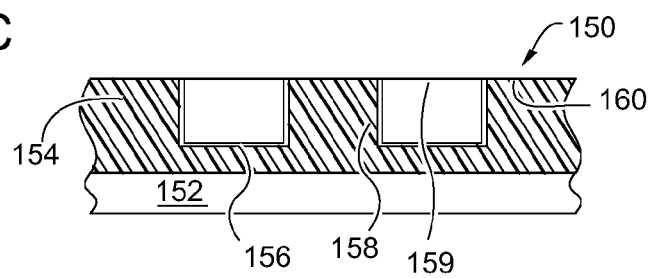

Once the substrate is positioned in the processing chamber, the substrate stack 150 can be exposed to a preclean gas during an anneal process at a first temperature, wherein the plurality of exposed methyl groups are preserved and wherein the contamination layer is removed, as in step 108. In this embodiment, which is depicted in FIG. 1C, the preclean gas 164 is flowed in contact with the substrate stack 150. Preclean gases which can be used in embodiments described herein include $H_2$, $NH_3$ or carbon monoxide (CO). The preclean gas 164 can be delivered at a flow rate of between 3000 sccm and 5000 sccm for a 300 mm substrate. Stated another way, the preclean gas 164 can be delivered at a flow rate per unit area of 3.333 sccm/cm² to 5.556 sccm/cm². The substrate stack 150 can be annealed in the presence of the preclean gas 164. The anneal temperature can be a temperature above 300° C., such as temperatures from about 350° C. to about 600° C. The substrate stack 150 can be annealed for between 45 seconds and 15 minutes. In one example, the substrate stack 150 is annealed for 60 seconds.

Without intending to be bound by theory, it is believed that the presence of methyl groups or other short chain hydrocarbons at the dielectric surface 160 provide a partial barrier to adsorption of the cobalt precursor during the cobalt deposition process. During a standard cleaning process to remove the contamination layer 162, the substrate stack 150 is exposed to a cleaning plasma, such as an ammonia plasma. The ammonia plasma, removes both the oxide/impurities formed in the contamination layer 162 and at least a portion of the plurality of methyl groups on the dielectric surface 160 of the dielectric layer 154. The result is improper deposition of cobalt on the dielectric surface 160. By using an anneal process in the presence of a seasoned chamber, the contamination layer can be removed, the plurality of methyl groups can be maintained on the dielectric surface 160 and outgassing from the chamber can be prevented from affecting the newly cleaned copper feature 158, shown in FIG. 1D.

Figure 1E:
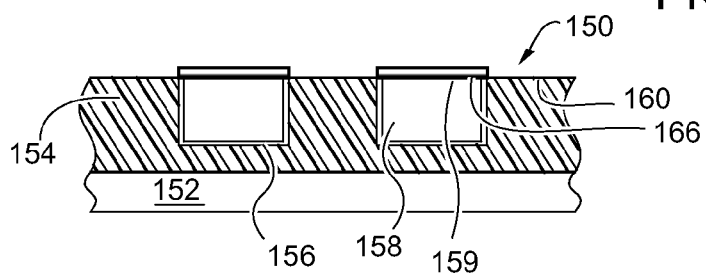
Figure 1F:
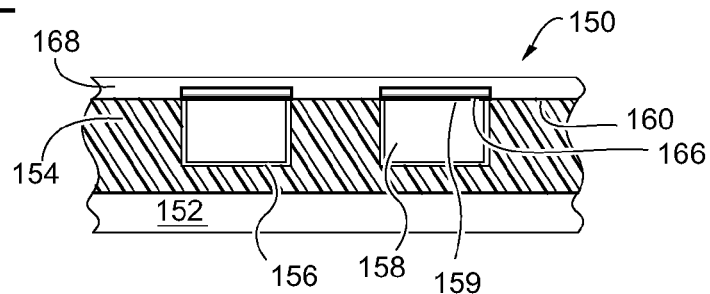

Once the preclean process is complete, the substrate stack 150 can be exposed to a deposition gas comprising a cobalt precursor gas at a second temperature to form a cobalt-containing layer 166 selectively over the copper surface 159, as in step 110. As shown in FIG. 1E, the cobalt containing layer 166 may be selectively deposited or formed on the copper surfaces 159 while avoiding deposition on the dielectric surface 160. The deposition of the cobalt-containing layer 166 will be discussed in more detail with reference to FIG. 2A-2H.

After the cobalt-containing layer 166 is formed, a dielectric barrier layer 168 can then be formed over the cobalt-containing layer 166 and the dielectric surface 160, as in step 112. Depicted in FIG. 1F, the dielectric barrier layer 168 having a low dielectric constant, may be deposited on substrate stack 150, across the dielectric surface 160 and over the cobalt-containing layer 166. The dielectric barrier layer 168 may contain a low-k dielectric material, such as silicon carbide, silicon nitride, silicon oxide, silicon oxynitride, silicon carbide oxide or carbon doped silicon oxide material, derivatives thereof, or combinations thereof. In one example, BLOK® low-k dielectric material, available from Applied Materials, Inc., located in Santa Clara, Calif., may be utilized as a low-k dielectric material for dielectric barrier layer 168.

In this embodiment, adhesion of the cobalt-containing layer 166 is increased due to the preclean anneal process described above. By removing the contamination layer 162 using a preclean anneal process, the copper surfaces 159 of the copper features 158 can be exposed without damaging the dielectric surface 160. Exposed hydrocarbon groups, such as exposed methyl groups, help the selectivity of the process to assure that the cobalt-containing layer 166 is deposited only on the copper surface 159 without significant deposition on the dielectric surface 160.

Porous Low-k Surface Conditioning

Pore distribution and pore size of the low k dielectrics affects cobalt deposition, where a tighter pore size distribution reduces cobalt deposition. In addition, higher carbon content suppresses cobalt deposition on low k dielectric surface. A selective carbon replenishment (also known as a low k repair) to the low k dielectric surface will help increase selectivity. The low k repair can be inserted after every or after multiple layer(s) of Co deposition. This low k repair has to be performed integrated without vacuum break in another chamber on the same main frame to prevent Co oxidation in air. The addition of carbon, such as methyl groups, in the low k repair process is not only believed to improve cobalt selectivity but also replenish the methyl that is removed by $NH_3$ plasma during the cobalt deposition process, which will in turn lower the capacitance. The low k repair step can also be applied after Co deposition is completed but before dielectric barrier deposition to replenish methyl groups removed by $NH_3$ plasma during cobalt deposition. This embodiment is more clearly described with reference to the figures below.

Figure 2A:
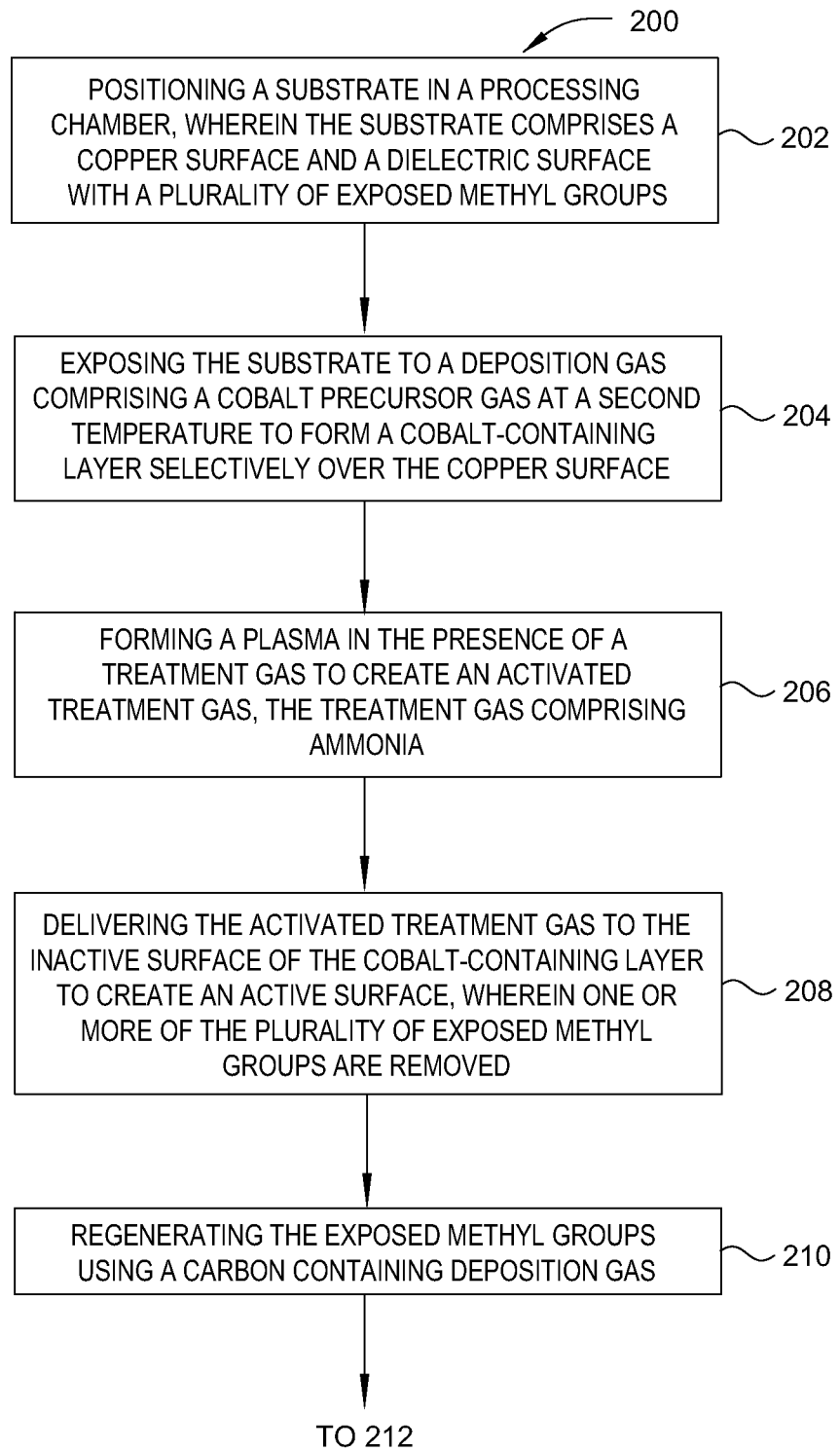
FIGS. 2A and 2B depict a flow chart illustrating a method for porous low-k surface conditioning according to one embodiment.
Figure 2B:
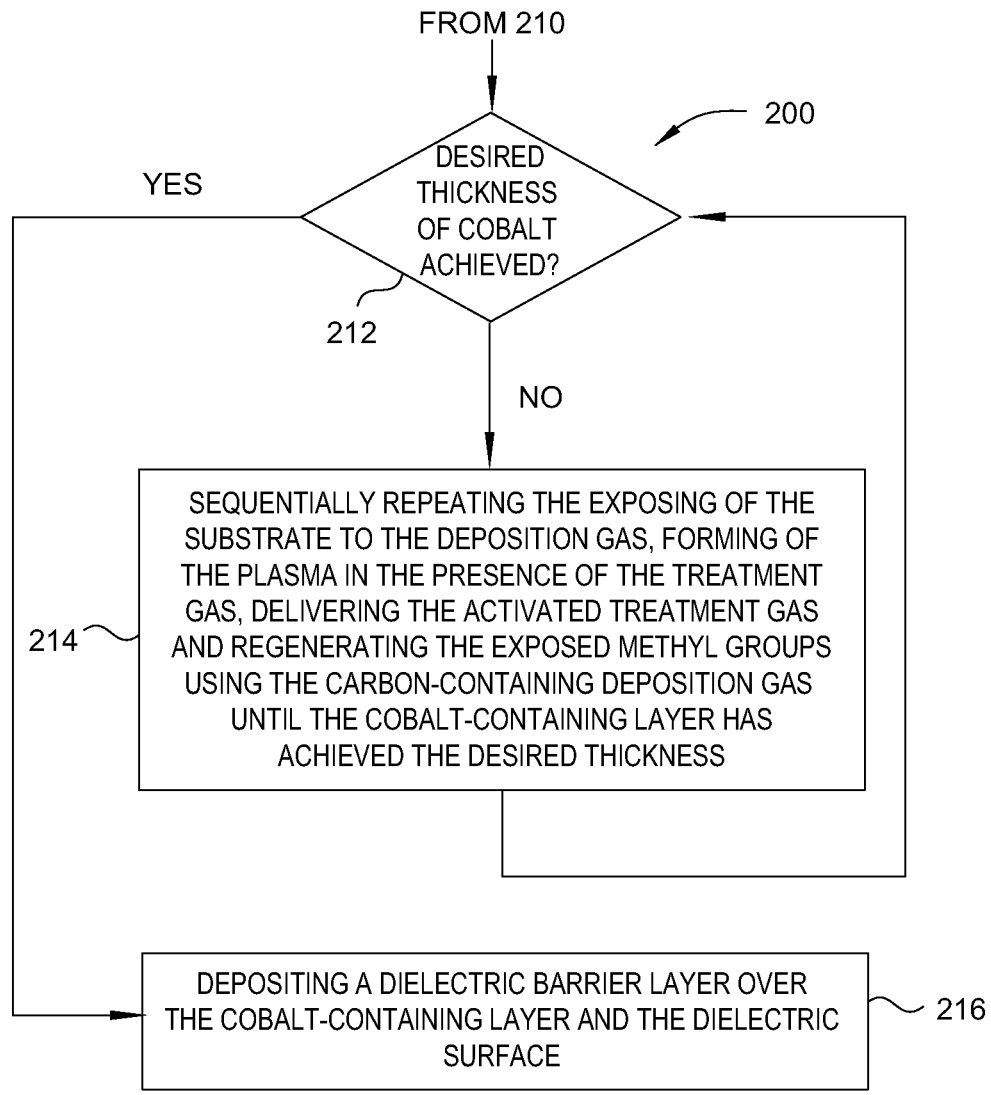

FIGS. 2A-2B depicts a flow chart illustrating a method 200 for porous low-k surface conditioning according to one embodiment. The method 200 may be used to prepare a low k surface for selective deposition of a cobalt cap over a copper surface on a substrate. In one embodiment, steps 202-216 of the method 200 may be used on substrate stack 250, depicted in FIGS. 2C-2H. The method 200 can begin with positioning a substrate in a processing chamber, wherein the substrate comprises a copper surface and a dielectric surface with a plurality of exposed methyl groups, as in step 202; exposing the substrate to a deposition gas comprising a cobalt precursor gas at a second temperature to form a cobalt-containing layer selectively over the copper surface, as in step 204; forming a plasma in the presence of a treatment gas to create an activated treatment gas, the treatment gas comprising ammonia, as in step 206; delivering the activated treatment gas to the inactive surface of the cobalt-containing layer to create an active surface, wherein one or more of the plurality of exposed methyl groups are removed, as in step 208; regenerating the exposed methyl groups using a carbon-containing deposition as, as in step 210; determining if the desired thickness of cobalt has been deposited, as in step 212; sequentially repeating the exposing of the substrate to the deposition gas, forming of the plasma in the presence of the treatment gas, delivering the activated treatment gas and regenerating the exposed methyl groups using a carbon containing deposition gas until the cobalt-containing layer has achieved the desired thickness, as in step 214; and depositing a dielectric barrier layer over the cobalt-containing layer and the dielectric surface, as in step 216.

Figure 2C:
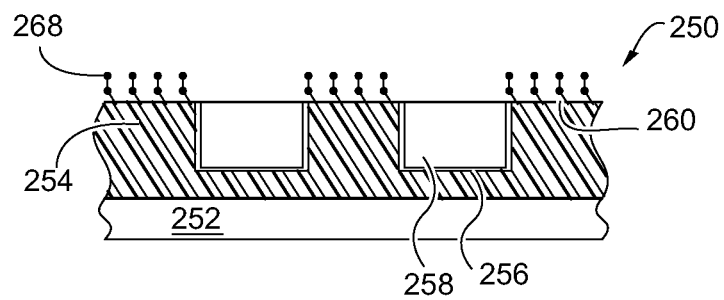
FIGS. 2C-2H depict schematic views of a substrate with a porous low-k surface conditioning and cobalt layer deposition according to one embodiment.

FIG. 2C depicts a substrate stack 250 including a dielectric layer 254 disposed over substrate 252 with a plurality of copper feature 258. The copper features 258 are depicted here as deposited over a barrier layer 256 and formed in a dielectric layer 254. A plurality of exposed methyl groups 268 are formed on the surface of the dielectric layer 254. The substrate 252, the barrier layer 256, the dielectric layer 254 and the copper features 258 can be substantially similar to the equivalent structures described with reference to FIGS. 1A-1F.

Figure 2D:
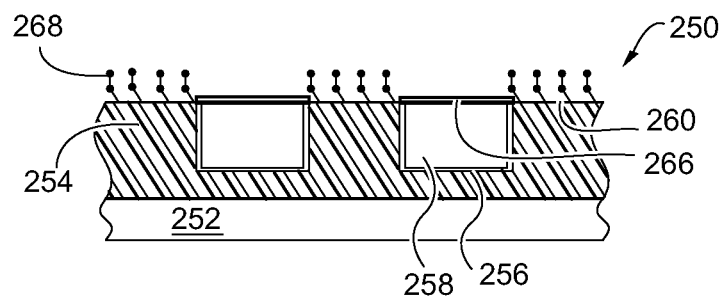

FIG. 2D depicts the substrate stack 250 with a cobalt-containing layer 266 disposed over the surface of the copper features 258. At step 204, the cobalt-containing layer 266 may be selectively deposited or formed on copper features 258 while leaving bare the exposed surfaces of the dielectric layer 254, as illustrated in FIG. 2D. Due to the presence of the exposed methyl groups 268, the cobalt-containing layer 266 is selectively deposited on copper features 258 while leaving the dielectric surface 260 free or at least substantially free of the cobalt-containing layer 266. Initially, the cobalt-containing layer 266 may be a continuous layer or a discontinuous layer across copper features 258.

The cobalt-containing layer 266 may be deposited by thermal decomposition of a cobalt containing precursor carried by an inert gas during step 120. A reducing gas may be co-flowed or alternately pulsed into the processing chamber along with the cobalt precursor. The substrate may be heated to a temperature within a range from about 50° C. to about 600° C., such as from about 100° C. to about 500° C., In one embodiment, the substrate is heated to a temperature of from about 200° C. to about 400° C. Alternatively, cobalt-containing layer 266 may be deposited by exposing the substrate to a cobalt containing precursor gas in an ALD or CVD process.

Suitable cobalt precursors for forming cobalt-containing materials (e.g., metallic cobalt or cobalt alloys) by CVD or ALD processes described herein include cobalt carbonyl complexes, cobalt amidinates compounds, cobaltocene compounds, cobalt dienyl complexes, cobalt nitrosyl complexes, derivatives thereof, complexes thereof, plasma thereof, or combinations thereof. In some embodiments, cobalt materials may be deposited by CVD and ALD processes further described in commonly assigned U.S. Pat. No. 7,264,846 and U.S. Ser. No. 10/443,648, filed May 22, 2003, and published as US 2005-0220998, which are herein incorporated by reference.

Suitable cobalt precursors can further include dimethylaminotrimethylsilane (DMA-TMS) and derivatives thereof, trimethylsilylacetate and derivatives thereof, or organosilanes such as trimethylsilane and derivatives thereof.

In embodiments which use liquid precursors, such as DMA-TMS or derivatives thereof, for repair, the substrate can be maintained at a temperature from 25° C. to 400° C., such as 250° C. or 385° C. The pressure in the chamber can be maintained from 1 to 760 Torr, such as 6 Torr. The liquid precursor can be delivered at from 100 to 4000 mgm liquid flow, such as 1000 mgm, with an inert carrier flow of from 100 to 4000 sccm, such as 2000 sccm. UV power can be delivered at from 40% to 100% of standard output, such as 90%. The exposure can be from 5 seconds to 15 minutes, such as 60 seconds.

In embodiments which use gaseous precursors, such as trimethylsilane or derivatives thereof, for repair, the substrate can be maintained at a temperature from 25° C. to 400° C., such as 250° C. or 385° C. The pressure in the chamber can be maintained from 1 to 760 Torr, such as 6 Torr. The an inert carrier flow of from 100 to 4000 sccm, such as 500 sccm, with an inert carrier flow of from 100 to 4000 sccm, such as 2000 sccm. UV power can be delivered at from 40% to 100% of standard output, such as 90%. The exposure can be from 5 seconds to 15 minutes, such as 60 seconds.

An ALD processing chamber used during embodiments described herein is available from Applied Materials, Inc., located in Santa Clara, Calif. A detailed description of an ALD processing chamber may be found in commonly assigned U.S. Pat. Nos. 6,916,398 and 6,878,206, commonly assigned U.S. Ser. No. 10/281,079, filed on Oct. 25, 2002, and published as U.S. Pub. No. 2003-0121608, and commonly assigned U.S. Ser. Nos. 11/556,745, 11/556,752, 11/556,756, 11/556,758, 11/556,763, each filed Nov. 6, 2006, and published as U.S. Pub. Nos. 2007-0119379, 2007-0119371, 2007-0128862, 2007-0128863, and 2007-0128864, which are hereby incorporated by reference in their entirety. In another embodiment, a chamber configured to operate in both an ALD mode as well as a conventional CVD mode may be used to deposit cobalt-containing materials is described in commonly assigned U.S. Pat. No. 7,204,886, which is incorporated herein by reference in its entirety. A detailed description of an ALD process for forming cobalt-containing materials is further disclosed in commonly assigned U.S. Ser. No. 10/443,648, filed on May 22, 2003, and published as U.S. Pub. No. 2005-0220998, and commonly assigned U.S. Pat. No. 7,264,846, which are hereby incorporated by reference in their entirety. In other embodiments, a chamber configured to operate in both an ALD mode as well as a conventional CVD mode that may be used to deposit cobalt-containing materials is the TXZ® showerhead and CVD chamber available from Applied Materials, Inc., located in Santa Clara, Calif.

Once the cobalt-containing layer is deposited, contaminants may collect over the substrate surface, such as on the cobalt-containing layer 266 as well as the dielectric surface 260. Contaminants may include by-products from the deposition process, such as carbon, organic residue, precursor residue, and other undesirable materials collected on the substrate surface.

Figure 2E:
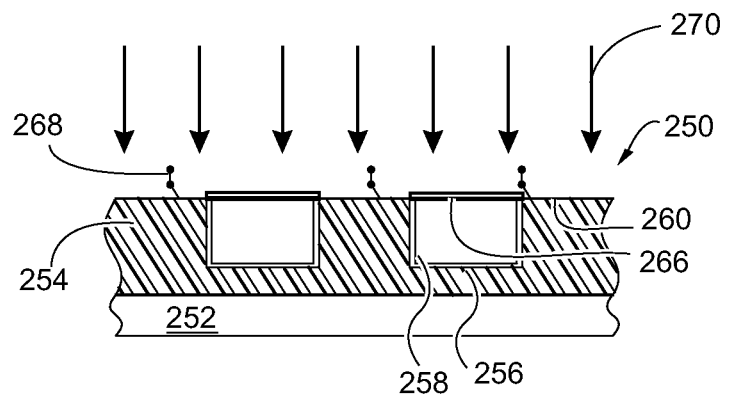
Figure 2F:
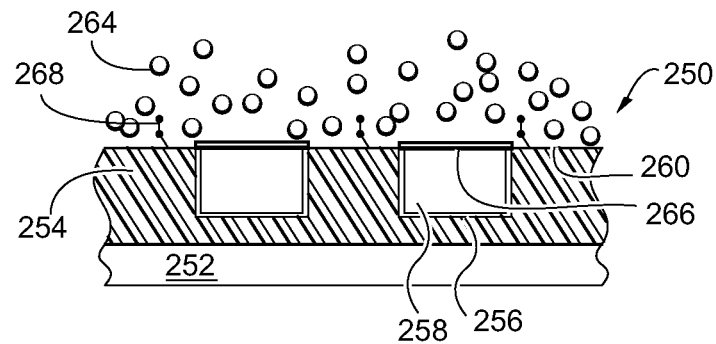

At steps 206 and 208, the substrate stack 250 may be exposed to an activated treatment plasma formed in situ or remotely during the post-treatment process, as depicted in FIG. 2E. The post-treatment process removes or reduces the amount of contaminants from substrate stack 250 while further densifying the cobalt-containing layer 266. The post-treatment process may expose the substrate stack 250 and the cobalt-containing layer 266 to a reducing agent during the plasma process. This process both activates the surface of the cobalt-containing layer 266 while simultaneously removing the exposed methyl groups 268 from the dielectric surface 260 of the dielectric layer 254. Reducing agents that are useful during the post-treatment process include hydrogen (e.g., $H_2$ or atomic-H), ammonia ($NH_3$), a hydrogen and ammonia mixture ($H_2/NH_3$), nitrogen (e.g., $N_2$ or atomic-N), hydrazine ($N_2H_4$), derivatives thereof, plasmas thereof, or combinations thereof. The cobalt-containing layer 266 may be exposed to the plasma during the post-treatment process for a time period within a range from about 2 seconds to about 60 seconds, preferably, from about 3 seconds to about 30 seconds, and more preferably, from about 5 seconds to about 15 seconds.

In one example, the cobalt-containing layer 266 is exposed to an ammonia plasma, formed by igniting ammonia gas in situ or remotely of the processing chamber. In another example, the cobalt-containing layer 266 is exposed to a hydrogen/ammonia plasma, formed by igniting a mixture of hydrogen gas and ammonia gas in situ or remotely of the processing chamber.

A plasma may be generated external from the processing chamber, such as by a remote plasma source (RPS) system, or the plasma may be generated in the processing region of a plasma capable deposition chamber, such as a PE-CVD chamber during a plasma treatment process. The plasma may be generated from a microwave (MW) frequency generator or a radio frequency (RF) generator. In one example, an in situ plasma is generated by a RF generator. The processing chamber may be pressurized during the plasma treatment process at a pressure within a range from about 0.1 Torr to about 80 Torr, preferably from about 0.5 Torr to about 10 Torr, and more preferably, from about 1 Torr to about 5 Torr. Also, the chamber or the substrate may be heated to a temperature of less than about 500° C., preferably within a range from about 100° C. to about 450° C., and more preferably, from about 150° C. to about 400° C., for example, about 300° C.

Though the activation of the cobalt-containing layer 266 is beneficial to further deposition of cobalt, the removal of the exposed methyl groups 268 reduces the specificity of the cobalt deposition process. Therefore, it is beneficial to regenerate the exposed methyl groups 268, as in step 210. In one embodiment. the dielectric surface 260 of the dielectric layer 254 may be repaired by a vapor phase silylation process. The vapor phase silylation process comprises contacting the dielectric layer with a vaporized silylation compound to create the Si—O—Si(CH$_3$)$_3$ groups in the dielectric layer. Vaporizing the silylation compound allows the silylation compound to penetrate deeply into the dielectric layer.

Depicted in FIG. 2E, is the substrate stack 250 with substrate 252, the dielectric layer 254, the barrier layer 256, the copper features 258 with the cobalt-containing layer 266 formed on the surface of the copper features 258. The surface of the substrate stack 250 can then be exposed to the carbon-containing deposition gas 264, such as a silylation compound, to regenerate the exposed methyl groups 268. Though embodiments described herein discuss regeneration of the exposed methyl groups 268 by silylation, other methods of regenerating exposed methyl groups may be used without diverging from the embodiments described herein. In other examples, UV radiation can be used to regenerate the exposed methyl groups 268 on the dielectric surface 260

Once the exposed methyl groups 268 have been regenerated, a determination should be made of whether the appropriate thickness has been met, as in step 212. The cobalt-containing layer 266 may be deposited having a thickness within a range from about 2 Å to about 30 Å, such as from about 3 Å to about 25 Å. In one embodiment, the cobalt-containing layer 266 has a thickness of from about 4 Å to about 20 Å. In another embodiment, the cobalt-containing layer 266 has a thickness of from about 5 Å to about 10 Å, such as about 7 Å or about 8 Å.

If the desired thickness for the cobalt-containing layer has not been achieved, the cobalt deposition can be repeated, as in step 214. The cobalt deposition cycle includes exposing the substrate to the deposition gas, forming the plasma in the presence of the treatment gas, delivering the activated treatment gas and regenerating the exposed methyl groups using the carbon containing deposition gas, as described with respect to steps 204, 206, 208 and 210 respectively.

Figure 2G:
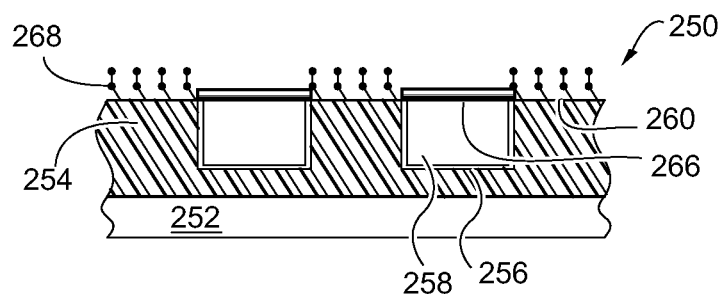

FIG. 2G depicts the substrate stack 250 with substrate 252, the dielectric layer 254, the barrier layer 256, the copper features 258 with the cobalt-containing layer 266 formed on the surface of the copper features 258. In this embodiment, a second cobalt layer is deposited to produce two layers of the cobalt-containing layer 266. By depositing the second layer followed by cleaning and repair of the exposed methyl groups 268, deposition of the cobalt can be prevented on the dielectric surface 260. In one example, two cycles of steps 204, 206, 208 and 210 are performed to form cobalt-containing layer 266 with a thickness of about 7 Å. In another example, three cycles of steps 204, 206, 208 and 210 are performed to form cobalt-containing layer with a thickness of about 8 Å.

Figure 2H:
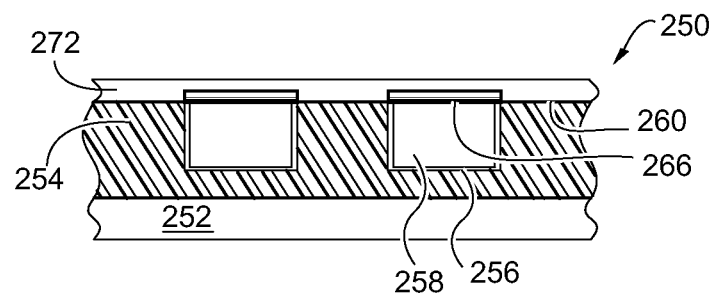

Once the desired thickness of the cobalt-containing layer 266 is achieved, a dielectric barrier layer 272 can then be formed over the cobalt-containing layer 266 and the dielectric surface 260, as in step 216. Depicted in FIG. 2H is the substrate stack 250 with substrate 252, the dielectric layer 254, the barrier layer 256, the copper features 258 with the cobalt-containing layer 266 formed on the surface of the copper features 258. The dielectric barrier layer 272 having a low dielectric constant, may be deposited on substrate stack 250, across the dielectric surface 260 and over cobalt-containing layer 266. The dielectric barrier layer 272 can be substantially similar to the dielectric barrier layer 168 described with reference to FIG. 1F.

Modified Cobalt Deposition Process

Described above, the deposition of cobalt can be made selective on the copper surfaces over the dielectric surfaces by maintaining the exposed methyl groups after ammonia post-treatment. Selectivity is important as the k value of the dielectric material is affected by deposition of cobalt onto and into the dielectric layer. Noble gases, such as argon, are generally used as a carrier gas for the cobalt-containing precursor. However, Noble gases carrier flow affects selectivity. By increasing hydrogen flow during the deposition process, selectivity can be improved.

Figure 3:
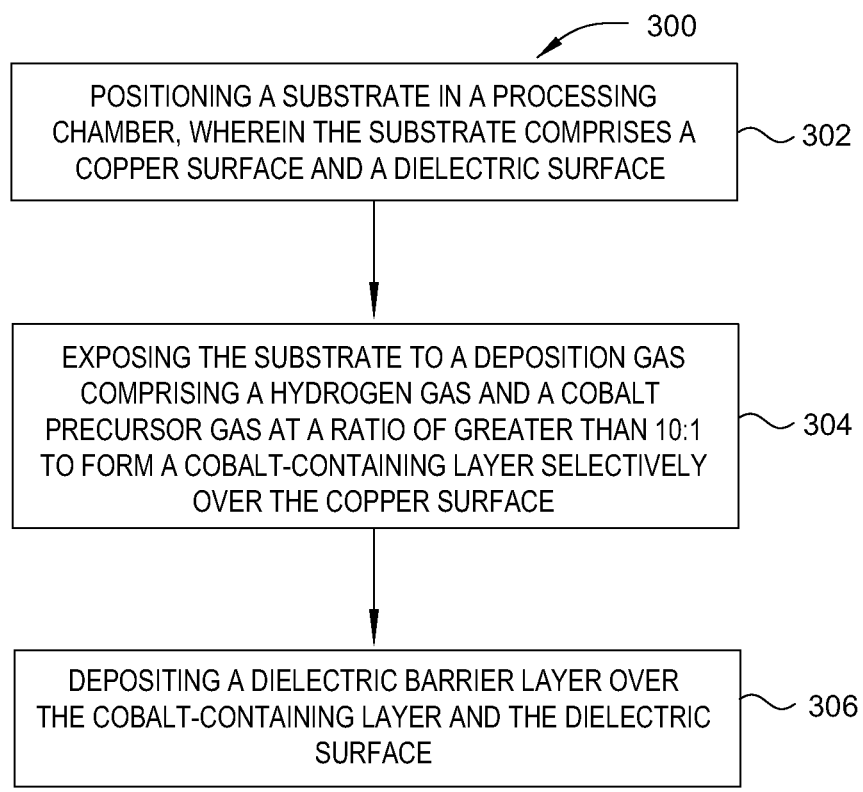
FIG. 3 depicts a method of cobalt layer deposition according to one embodiment.

FIG. 3 depicts a method 300 of cobalt layer deposition according to one embodiment. The method 300 begins at step 302 with positioning a substrate in a processing chamber, wherein the substrate comprises a copper surface and a dielectric surface. The substrate can be a substrate with exposed copper surfaces and exposed dielectric surfaces, as described with reference to FIGS. 1A and 1B.

Once positioned, the substrate is exposed to a deposition gas comprising a hydrogen gas and a cobalt-containing precursor gas at a ratio of greater than 10:1 to form a cobalt containing layer selectively over the copper surface, as in step 304. As described above, deposition of the cobalt-containing layer in the presence of high hydrogen, can increase the selectivity of the cobalt layer for the copper surfaces over the dielectric surfaces. By maintaining as ratio of 10:1 of the hydrogen-based gas to the cobalt-containing gas, the selectivity ratio of the deposited cobalt can be maintained above 10:1. The deposition parameters, the precursors gases and other criteria for deposition of the cobalt-containing layer can be substantially similar to the cobalt-containing layer deposition described with reference to FIGS. 2A-2G After the cobalt-containing layer is formed, a dielectric barrier layer can be deposited over the cobalt containing layer and the dielectric surface, as in step 306. Once the cobalt-containing layer is deposited, a dielectric barrier layer can be deposited over the surface of the substrate stack. The dielectric barrier layer can be substantially similar to the dielectric barrier layer 168 described with reference to FIGS. 1A and 1F.

While the foregoing is directed to embodiments of the invention, other and further embodiments of the invention may be devised without departing from the basic scope thereof, and the scope thereof is determined by the claims that follow.

The invention claimed is:

1. A method for forming a cobalt cap, comprising:
    positioning a substrate within a processing chamber, wherein the substrate comprises a copper surface with a contamination layer and a dielectric surface with a plurality of exposed methyl groups;
    exposing the substrate to a preclean gas during an anneal process at a first temperature, wherein the plurality of exposed methyl groups are preserved and wherein the contamination layer is removed;
    exposing the substrate to a cobalt deposition gas comprising a cobalt precursor gas at a second temperature to form a cobalt-containing layer selectively over the copper surface; and
    depositing a dielectric barrier layer over the cobalt-containing layer and the dielectric surface.

2. The method of claim 1, further comprising seasoning the processing chamber prior to positioning the substrate, the seasoning of the processing chamber comprising:
    exposing the processing chamber to a silicon nitride deposition gas in the presence of high RF power; and
    exposing the processing chamber to a densifying gas comprising ammonia in the presence of high RF power.

3. The method of claim 1, wherein the substrate is moved to a second chamber to expose the substrate to the cobalt deposition gas.

4. The method of claim 1, wherein the substrate is exposed to a deposition gas comprising the cobalt precursor gas and hydrogen gas during a vapor deposition process, wherein the vapor deposition process is a thermal chemical vapor deposition process or an atomic layer deposition process.

5. The method of claim 1, wherein the first temperature is from about 350° C. to about 600° C.

6. The method of claim 1, wherein the second temperature is from about 200° C. to about 400° C.

7. The method of claim 1, wherein the cobalt deposition gas further comprises hydrogen ($H_2$) at a hydrogen to cobalt-containing gas ratio of greater than 10:1.

8. A method for forming a cobalt cap, comprising:
    positioning a substrate within a processing chamber, wherein the substrate comprises a copper surface and a dielectric surface with a plurality of exposed methyl groups;
    exposing the substrate to a deposition gas comprising a cobalt precursor gas at a first temperature to form a cobalt-containing layer selectively over the copper surface, the cobalt-containing layer comprising an inactive surface;
    forming a plasma in the presence of a treatment gas to create an activated treatment gas, the treatment gas comprising ammonia;
    delivering the activated treatment gas to the inactive surface of the cobalt-containing layer to create an active surface, wherein one or more of the plurality of exposed methyl groups are removed;
    regenerating the exposed methyl groups using a carbon containing deposition gas;
    sequentially repeating the exposing of the substrate to the deposition gas, forming of the plasma in the presence of the treatment gas, delivering the activated treatment gas and regenerating the exposed methyl groups using the carbon containing deposition gas until the cobalt-containing layer has achieved the desired thickness; and
    depositing a dielectric barrier layer over the cobalt-containing layer and the dielectric surface.

9. The method of claim 8, wherein the treatment gas comprises a gas selected from the group consisting of nitrogen ($N_2$), ammonia ($NH_3$), hydrogen ($H_2$), ammonia/nitrogen mixture, and combinations thereof.

10. The method of claim 8, wherein the cobalt-containing surface is exposed to the activated treatment gas for a time period within a range from about 5 seconds to about 15 seconds.

11. The method of claim 8, wherein the sequential repeat occurs at least twice.

12. The method of claim 8, wherein the carbon-containing deposition gas comprises carbon, silicon and hydrogen.

13. A method for forming a cobalt cap, comprising:
    exposing the processing chamber to a silicon nitride deposition gas in the presence of high RF power;
    exposing the processing chamber to a densifying gas comprising ammonia in the presence of high RF power;
    positioning a substrate within a processing chamber, wherein the substrate comprises a copper surface with a contamination layer and a dielectric surface with a plurality of exposed methyl groups;
    exposing the substrate to a preclean gas during an anneal process at a first temperature, wherein the exposed methyl groups are preserved and wherein the contamination layer is removed;
    exposing the substrate to a deposition gas comprising a cobalt precursor gas at a second temperature to form a cobalt-containing layer selectively over the copper surface, the cobalt-containing layer comprising an inactive surface;

forming a plasma in the presence of a treatment gas to create an activated treatment gas, the treatment gas comprising ammonia;

delivering the activated treatment gas to the inactive surface of the cobalt-containing layer to create an active surface, wherein one or more of the plurality of exposed methyl groups are removed;

regenerating the exposed methyl groups using a carbon containing deposition gas;

sequentially repeating the exposing of the substrate to the deposition gas, forming of the plasma in the presence of the treatment gas, delivering the activated treatment gas and regenerating the exposed methyl groups using a carbon containing deposition gas until the cobalt-containing layer has achieved the desired thickness; and depositing a dielectric barrier layer over the cobalt-containing layer and the dielectric surface.

14. The method of claim 13, further comprising seasoning the processing chamber prior to positioning the substrate, the seasoning of the processing chamber comprising:

exposing the processing chamber to a silicon nitride deposition gas in the presence of high RF power; and exposing the processing chamber to a densifying gas comprising ammonia in the presence of high RF power.

15. The method of claim 13, wherein the substrate is moved to a second chamber to expose the substrate to the cobalt deposition gas.

16. The method of claim 13, wherein the substrate is exposed to a deposition gas comprising the cobalt precursor gas and hydrogen gas during a vapor deposition process, wherein the vapor deposition process is a thermal chemical vapor deposition process or an atomic layer deposition process.

17. The method of claim 13, wherein the first temperature is from about 350° C. to about 600° C. and the second temperature is from about 200° C. to about 400° C.

18. The method of claim 13, wherein the cobalt deposition gas further comprises hydrogen ($H_2$) at a hydrogen to cobalt-containing gas ratio of greater than 10:1.

19. The method of claim 13, wherein the treatment gas comprises a gas selected from the group consisting of nitrogen ($N_2$), ammonia ($NH_3$), hydrogen ($H_2$), ammonia/nitrogen mixture, and combinations thereof.

20. The method of claim 13, wherein the cobalt-containing surface is exposed to the activated treatment gas for a time period within a range from about 5 seconds to about 15 seconds.

* * * * *